United States Patent [19]

Whewell et al.

[11] Patent Number: 5,017,271
[45] Date of Patent: May 21, 1991

[54] METHOD FOR PRINTED CIRCUIT BOARD PATTERN MAKING USING SELECTIVELY ETCHABLE METAL LAYERS

[75] Inventors: Christopher J. Whewell, Chesterland; Sidney J. Clouser, Chardon; Chin-ho Lee, Lyndhurst, all of Ohio

[73] Assignee: Gould Inc., Eastlake, Ohio

[21] Appl. No.: 572,849

[22] Filed: Aug. 24, 1990

[51] Int. Cl.$^5$ .................. C25D 5/02; B05D 03/04; B05D 5/10
[52] U.S. Cl. .................................. 204/15; 427/98; 427/304; 427/305
[58] Field of Search ................ 204/15, 38.4; 427/96

[56] References Cited

U.S. PATENT DOCUMENTS

| 3,469,982 | 9/1969 | Celeste | 96/35.1 |
| 3,857,681 | 12/1974 | Yates et al. | 428/626 |
| 3,981,691 | 9/1976 | Cunro | 428/626 |
| 4,049,481 | 9/1977 | Morisaki . | |
| 4,082,620 | 4/1978 | Skurkiss | 204/15 |
| 4,705,592 | 11/1987 | Bahrle et al. | 156/630 |
| 4,863,808 | 9/1989 | Sallo | 204/38.4 |

FOREIGN PATENT DOCUMENTS 690691 4/1953 United Kingdom .

OTHER PUBLICATIONS

"Soviets Offer PCB Technology", Electronic Buyers News, Sep. 3, 1990, p. 2.

"Copper Foil for Printed Wiring Applications", IPC Standard 1981, May 1981.

Bupp, et al., "High-Density Board Fabrication Techniques", IBM J. Res. Dev., vol. 26, No. 3, May 1982.

Bucci et al., "Copper Foil Technology", PC FAB, Jul. 1986.

Primary Examiner—John F. Niebling
Assistant Examiner—Kishor Mayekar
Attorney, Agent, or Firm—Renner, Otto, Boisselle & Sklar

[57] ABSTRACT

The present invention provides a method for producing high density electronic circuit boards comprising the steps of depositing a layer of a first metal upon a layer of foil to produce a composite then attaching the composite to an insulative support to produce a laminate. The layer of foil is then removed from the layer of first metal. Photoresist is then applied to the layer of first metal, exposed and developed. During the development of the photoresist portions of the photoresist are removed from the layer of first metal. A layer of third metal is then plated upon the portions of the layer of first metal that are not covered by the photoresist. All remaining photoresist and the portions of the layer of first metal which are not covered by the third metal are then removed producing a finished fine-line pattern having conductive and insulative areas. The finished fine-line pattern may then be utilized to produce a circuit board.

30 Claims, 2 Drawing Sheets

METHOD FOR PRINTED CIRCUIT BOARD PATTERN MAKING USING SELECTIVELY ETCHABLE METAL LAYERS

This invention relates to printed circuit boards which are produced utilizing metal foils. More particularly, the invention concerns a method of producing fine-line patterns that are utilized in the production of printed circuit boards. The fine-line patterns are produced utilizing metal foil to form selectively etchable metal layers.

BACKGROUND

Most electronic devices such as, for example, computers, televisions, radio receivers and amplifiers include electronic circuits formed by printed circuit boards. The art of printed circuit board fabrication which arose from the efforts of Strong et al, as disclosed in British Patent No. 690,691, has had a profound impact upon modern society. Ever since the initial efforts by Strong et al it has been an ongoing goal of the printed circuit board industry to increase the number of electrical circuit components which can be provided on a given circuit board surface area.

The prior art provides a method of producing a printed circuit board wherein a piece of conductive metallic foil (e.g., copper (Cu) foil) is laminated to a dielectric substrate or insulative support to produce what is known in the prior art as a printed circuit laminate blank. Generally, the dielectric substrate or insulative support is produced by impregnating woven glass reinforcement materials with partially cured resins, such as epoxy resins. The metallic foil is laminated to the insulative support by placing the metallic foil and the support into a laminating press which subjects the foil and support to elevated temperatures and pressures to fully cure, thereby bonding the foil to the support to produce a laminate comprising a resin layer having bonded thereto the metallic foil.

Generally, the metallic foil is produced by electrochemical processes in a cell containing an anode, a cathode, an electrolyte solution containing metal ions, and a source of current. Through the application of voltage between the anode and the cathode the deposition of the metal in solution is effected upon the cathode surface. The surface of the metallic foil which forms opposite to the surface which is in contact with the cathode surface includes a matte finish. During the process of laminating the metallic foil to the support this matte surface is placed in contact with the support.

Preferably, prior to the laminating process the matte surface of the foil is subjected to a process which involves the deposition of a bonding or anchoring treatment on the matte surface. This treatment increases the surface area of the foil and enhances the bondability (i.e., mechanical and chemical bonding) of the foil in order to promote adhesion with the support. The matte surface may also be subjected to additional treatments including plating or depositing thereon a thermal barrier layer to help prevent degradation of the bond between the metal foil and the insulative support during subsequent processing of the printed circuit board. In cases where copper foil is used to produce the printed circuit laminate blank, such additional treatments may include the deposition or plating of a binary alloy consisting of zinc (Zn) and tin (Sn) which serves as a barrier layer against copper migration into the resin support of the laminate as disclosed in Morisaki U.S. Pat. No. 4,049,481.

Once the laminate blank has been formed, it is then coated with a photosensitive polymer film or photoresist as disclosed in U.S. Pat. No. 3,469,982. Then, either a photographic negative or positive (hereinafter referred to as a "photographic tool") is placed on top of the laminate and in intimate contact with the photoresist. Light of the proper frequency is then caused to strike the areas of the photoresist which are not shielded by the photographic tool. Irradiation with the light causes a reaction in the photoresist which causes the exposed areas to become insoluble in a special liquid chemical or developer. The irradiated board is then developed by soaking the board in the developer which causes the unexposed or non-irradiated portions of the photoresist to be washed away, leaving a bare metallic foil surface in certain areas, the dimensions of which are controlled or dictated by the pattern of the photographic tool.

The exposed metallic foil is then removed by a suitable chemical etching solution. After stripping away the remaining photoresist, a semi-finished circuit board results having conductive and insulative areas in certain desired positions.

The above described prior art method of producing a printed circuit board presents at least one drawback. More particularly, the conductive lines or paths formed on the insulative support usually do not possess rectangular dimensions. Specifically, from the cross-sectional perspective, the conductive lines are curved inwardly due to the undercut of the chemical etching solution utilized to remove the areas of the metallic foil that are not protected by the photoresist. The degree to which this undercutting occurs influences the minimum size possible for manufacturing conductive lines on the layer of resin.

One method by which the phenomena of undercutting the photoresist with the etching solution may be minimized is by the use of a thinner layer of conductive foil in the make-up of the laminate blank. The thinner the conductive foil, the greater will be the resolution or number of conductive paths per given area. However, a point is reached when the conductive foil is made too thin to carry sufficient electrical current. In such cases, it becomes necessary to use the technique of electroplating the conductive areas with the desired metal after the conductive and insulative areas of the printed circuit board have been defined, until an acceptable thickness is reached.

Another prior art method of producing circuit boards is discussed in "Background Of The Invention" section of Barhle et al U.S. Pat. No. 4,705,592. This method includes laminating layers of copper (totalling about 75 microns) to both sides of an insulative support or substrate. Approximately 70 microns of the copper are then removed by etching. The circuit board is then cleaned and a photoresist applied and developed. Copper is then electrolessly deposited to form the circuit lines on the circuit board and tin is then deposited on the circuit lines. The remaining photoresist is removed and the copper which has not been plated with tin is then etched away. The protective tin coating is then removed thereby rendering a finished circuit board. One disadvantage presented by this prior art process is that the electroless deposition of the copper to form the circuit lines is very slow and expensive. Also, if not applied properly, the electrolessly deposited copper can be quite brittle. Additionally, precisely removing the 70 microns of copper so as to leave 5 microns of copper on the surface of the substrate can be difficult.

Barhle et al also discloses another prior art method for producing circuit boards which employs differential etching. More particularly, such prior art method includes blanket sputtering copper onto an insulative substrate. Photoresist is then applied and developed. Copper is then plated upon the exposed sputtered copper. The remaining photoresist is then stripped and the exposed sputtered copper is removed by differential etching. This prior art method presents some disadvantages in that the acid utilized to remove the sputtered copper also tends to attack the plated copper. Also, sputtering of copper is generally more expensive than plating or laminating, and sputtered copper tends to display poor metallurgical properties (e.g., it can be brittle or poorly bonded to the substrate).

SUMMARY OF INVENTION

The present invention provides a new and improved method of producing printed circuit boards having conductive and insulative areas on the board on the order of less than about 0.002 inch. Such circuit boards allow an increased number of electronic components to be mounted upon the board. The present invention also eliminates the need for a pre-treatment of the metallic surfaces prior to the application of the photoresist, and allows for better resolution in the photo imaging process. The invention further provides a circuit board having an improved diffusion barrier layer for it allows the use of metals during the production of the circuit board that are stable and less likely to diffuse. The present invention also allows the use of metals that would not be classified as "copper etchable" (i.e., metals that are etched in a similar manner and rate as copper).

In one preferred embodiment a printed circuit board made in accordance with the principles of the present invention is produced by depositing a layer of first metal, such as chromium (Cr), on the matte side of a layer of second metal, such as copper foil, so as to produce a composite. The composite is then laminated to an insulative support or prepreg such that the layer of chromium is sandwiched between the copper foil and the support.

Subsequent to lamination all of the copper foil is removed such that the layer of chromium remains intact with the insulative support. A photoresist is then applied to the layer of chromium and the photoresist is then masked with a photographic tool, irradiated and developed. A layer of a third metal such as copper is then deposited onto the unprotected areas (i.e., the areas of the layer of chromium wherein the photoresist has been removed during development) of the layer of chromium.

All photoresist remaining on the laminate is then removed. Finally, the areas of the layer of chromium which were located beneath the developed photoresist are removed rendering a finished fine-line pattern having conductive and insulative areas formed thereon. The finished fine-line pattern may then be utilized to produce a circuit board.

The foregoing and other features of the invention are hereinafter more fully described and particularly pointed out in the claims, the following description and the annexed drawings setting forth in detail certain illustrative embodiments of the invention, these being indicative, however, of but a few of the various ways in which the principles of the invention may be employed.

DETAILED DESCRIPTION OF PREFERRED EMBODIMENTS

Figure 1:
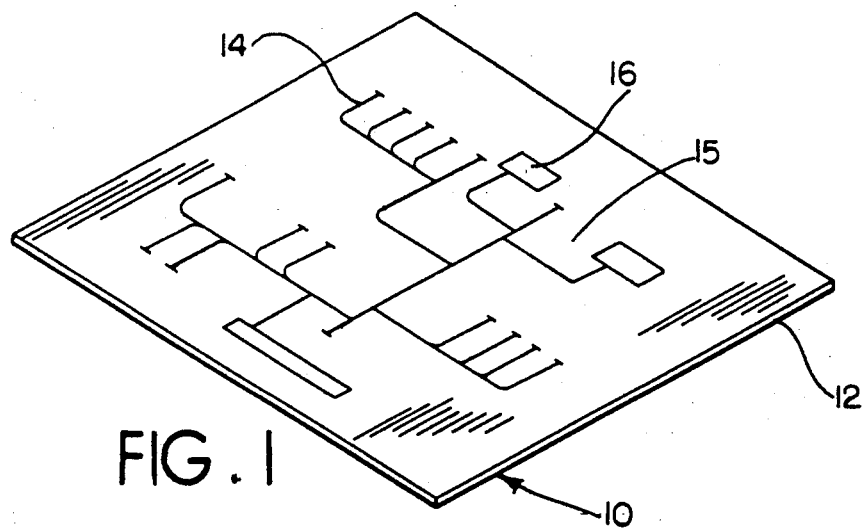
FIG. 1 is a perspective view of a printed circuit board made in accordance with the principles of the present invention.

Referring to the drawings and initially to FIG. 1 there is illustrated a printed circuit board 10 made in accordance with the principles of the present invention. Circuit board 10 comprises an insulative support or substrate 12 having an electrically conductive path or conductive lines 14 and insulative spaces 15 formed thereon. Conductive path 14 serves to electrically connect various types of electronic components 16. Examples of such electronic components 16 include diodes, resistors, capacitors, and various types of semiconductor devices.

Figure 2:
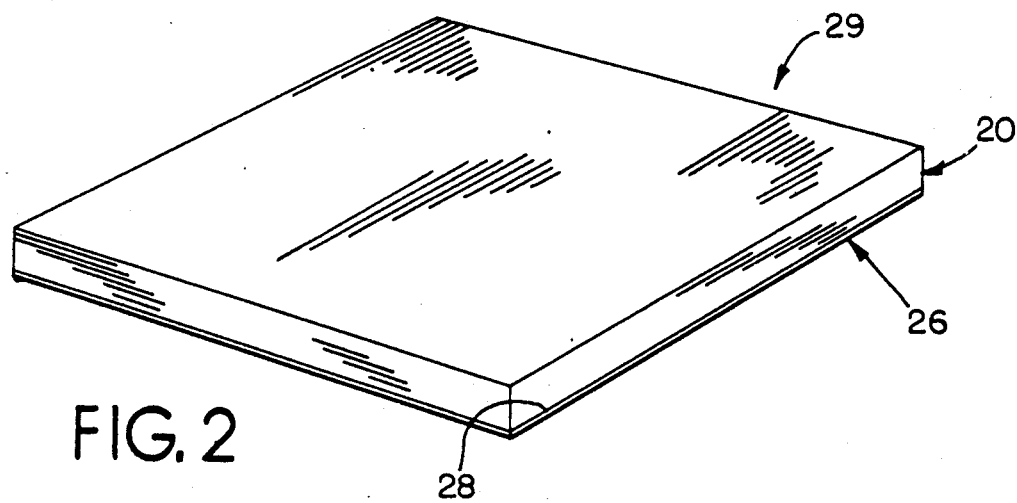
FIG. 2 is a perspective view of a section of copper foil having formed thereon a layer of chromium to produce a composite of selectively etchable metal layers.

In one preferred embodiment circuit board 10 is produced by first taking a section of electrically conductive copper foil 20 and depositing, or preferably electroplating thereon a layer of chromium 26 having a thickness of about 0.1 to about 5 microns so as to produce the composite 29 shown in FIG. 2. As used herein this specification and the claims found below the terms "depositing" or "deposited" are intended to be afforded the broadest interpretation possible including forming an adherent layer of metal upon another metal layer or surface utilizing any one of a variety of techniques including, for example, electroplating or electrodeposition, sputtering, electroless deposition and diffusion bonding or welding.

Copper foil 20 may be produced using any one of a variety of manufacturing techniques. Preferably, the copper foil 20 is as thin as possible and not more than about 35 microns in thickness. Also, preferably the copper foil 20 includes a matte surface 28 having a matte finish of about 10 microns Rtm. This matte finish is imparted to both of the major surfaces of the layer of chromium 26 during the electroplating of the chromium upon the copper foil 20.

Figure 3:
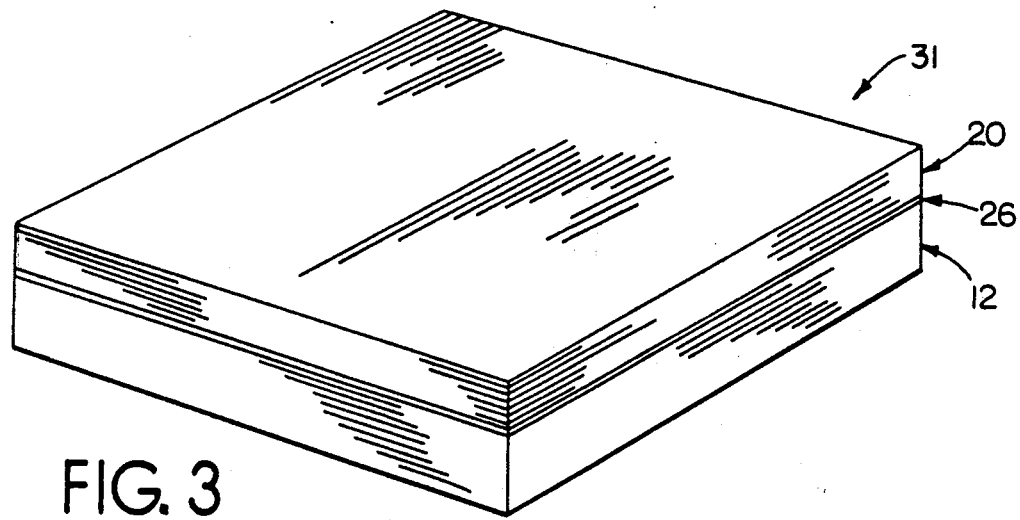
FIG. 3 is a perspective view of the composite shown in FIG. 2 laminated to an insulative support to produce a metal layers laminate.

After composite 29 has been formed it is then laminated onto the substrate 12 such that the layer of chromium 26 is sandwiched between the copper foil 20 and the substrate 12 to produce a metal layers laminate 31 as shown in FIG. 3. The matte finish which has been imparted to the layer of chromium 26 by the matte finish of the copper foil 20 enhances the bond formed between the layer of chromium 26 and the support 12.

In an alternative method metal layers laminate 31 may be produced by taking composite 29 and sputtering a suitable insulative plastic material upon the layer of chromium 26.

Example of materials suitable for use as substrate 12 include amino type resins produced from the reaction product of formaldehyde and urea or formaldehyde (H.CHO) and melamine ($N:C(NH_2).N:C(NH_2).N:C(NH_2)$), epoxy type resins, polyester resins, phenolic made by the reaction of phenol ($C_6H_5.OH$) and formaldehyde, silicones, polyamides, di-allyl phthalates, phenysilane resins, polybenizimidazole, diphenyloxides, polytetrafluoroethylene ($CF_2.CF_2$) or ceramics such as alumina ($Al_2O_3$), beryllium oxide (BeO), silicon (Si), aluminum nitride (AlN), silica dioxide ($SiO_2$) or boron nitride (BN).

Although various techniques such as sputtering and electroless deposition may be utilized to produce metal layers laminate 31, preferably, in order to minimize the costs associated with producing the metal layers laminate 31, metal foil is utilized and a layer of metal is formed on the foil by electroplating or electrodeposition. More particularly, foil generally forms a relatively less expensive metal layer, especially when working with copper, as compared to other metal layer forming techniques. Similarly, the formation of the metal layer upon the foil utilizing electroplating or electrodeposition techniques is generally less expensive and less time consuming than utilizing alternative techniques such as sputtering or electroless deposition.

After the metal layers laminate 31 has been formed the copper foil 20 is then removed from the layer of chromium 26 utilizing selective etching techniques that allow the copper foil 20 to be removed without removing or detrimentally affecting the layer of chromium 26. Examples of suitable acids include $CuX_2HX$ aqueous mixtures where X comprises fluorine, chlorine, bromine or iodine, dilute or concentrated solutions of nitric acid $HNO_3$, oxidizing acids such as $HXO_4$, $HXO_3$, $HXO_2$ or HXO where X comprises chlorine (Cl), bromine (Br) or iodine (I), $HMnO_4$, non-oxidizing hydrogen cyanide (HCN) aqueous or solutions of its anion, aqueous ammonia ($NH_3$), concentrated sulfuric acid ($H_2SO_4$), $N_2O_4$ in glacial acetic acid ($CH_3.COOH$), ferric chloride ($FeCl_3$) aqueous solution, or ammonium persulfate ($NH_4S_2O_8$) aqueous solution. Preferably, using a solution of about 1.2 molar cupric chloride ($CuCl_2$) the layer of copper foil 20 is removed. Preferably, the cupric chloride solution contains hydrochloric acid (HCl) at a normality of about 1.5N.

Figure 4:
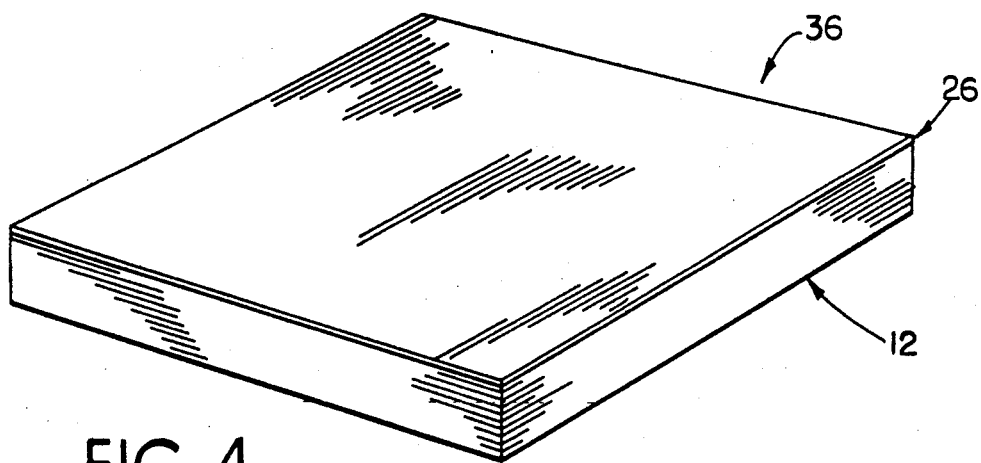
FIG. 4 is a perspective view of the laminate shown in FIG. 3 with the layer of copper foil removed to produce a thin foil laminate.

The laminate 31 is exposed to the cupric chloride solution for a sufficient period of time to allow the cupric chloride solution to chemically remove or etch away the copper foil 20 without any meaningful etching, disruption or removal of the underlying layer of chromium 26 thereby producing a thin metal laminate or, specifically, thin foil laminate 36 as shown in FIG. 4. Preferably, the step of chemically removing the layer of copper foil 20 is conducted with the cupric chloride solution maintained at a temperature of about 50° C. Care must be taken to keep the laminate 31 in the cupric chloride solution only for a sufficient amount of time to remove the copper foil 20 from the layer of chromium 26.

After the copper foil 20 has been removed, the thin foil laminate 36 then has applied thereto a layer of photoresist. No surface pretreatment of the layer of chromium 26 is necessary in order to ensure proper adherence of the photoresist since the layer of chromium 26 has a suitable matte surface imparted thereto by the matte of the copper foil 20. Any one of a variety of commercially available photoresists may be utilized. An example of a photoresist suitable for use with the present invention is a semi-aqueous photopolymeric dry film photoresist sold under the registered trademark RISTON by the E. I. DuPont de Nemours & Co., Riston Products Division, Wilmington, Del. 19898.

Figure 5:
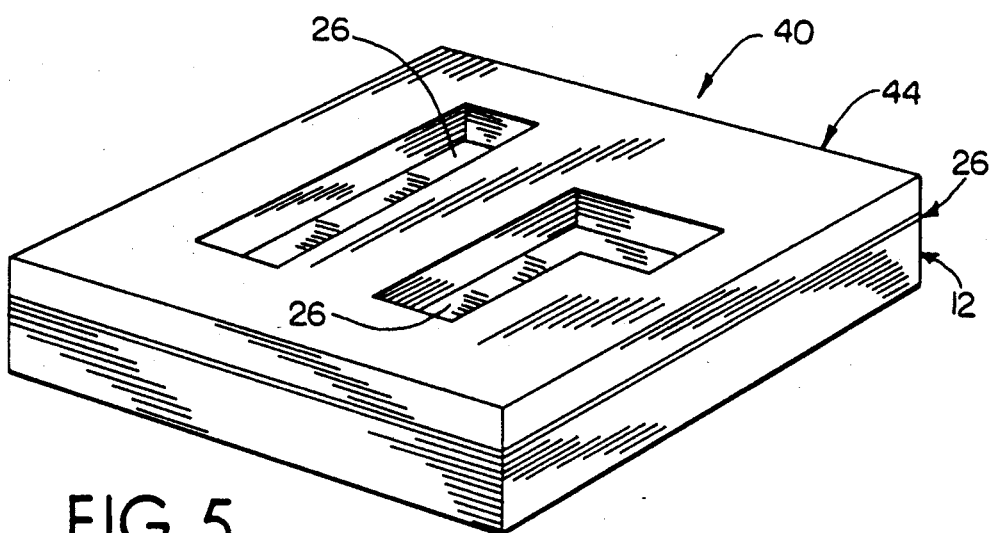
FIG. 5 is a perspective view of the laminate of FIG. 4 subsequent to the application and development of a photoresist to produce a photo-imaged and developed pattern.

After the application of the photoresist a photographic tool embodying the desired pattern is then placed over the thin foil laminate 36. The tool and the photoresist are then exposed or irradiated with a suitable light source so as to produce a photo imaged negative which is then chemically developed. During the chemical development the non-irradiated portions of the photoresist are soluble in the developer and thus removed, and the irradiated portions of the photoresist which are insoluble in the developer become fixed to the layer of chromium 26 thereby producing the photoimaged and developed negative pattern 40 shown in FIG. 5. Any one of a variety of commercially available developers may be utilized to develop the photoresist. An example of a developer suitable for use with a semi-aqueous photoresist is a developer entitled Developer 200 Concentrate-Parts A and B, sold under the registered trademark RISTON by the E. I. DuPont de Nemours & Co.

Pattern 40 comprises the substrate 12 having the layer of chromium 26 and a layer of photoresist 44 formed thereon with portions of the photoresist 44 removed thereby exposing or rendering portions of the layer of chromium 26 uncovered. The uncovered portions of the layer of chromium 26 are then deposited upon, and preferably, electroplated with a layer of conductive metal such as copper 54 to a thickness of about 10 to about 25 microns. The plated pattern is then chemically treated with any one of a variety of commercially available photoresist removers so as to remove the exposed or the remaining photoresist 44. An example of a photoresist remover or stripper suitable for use with either an aqueous or semi-aqueous photoresist is a solution of potassium hydroxide (KOH) comprising 40 grams/liter potassium hydroxide.

Figure 6:
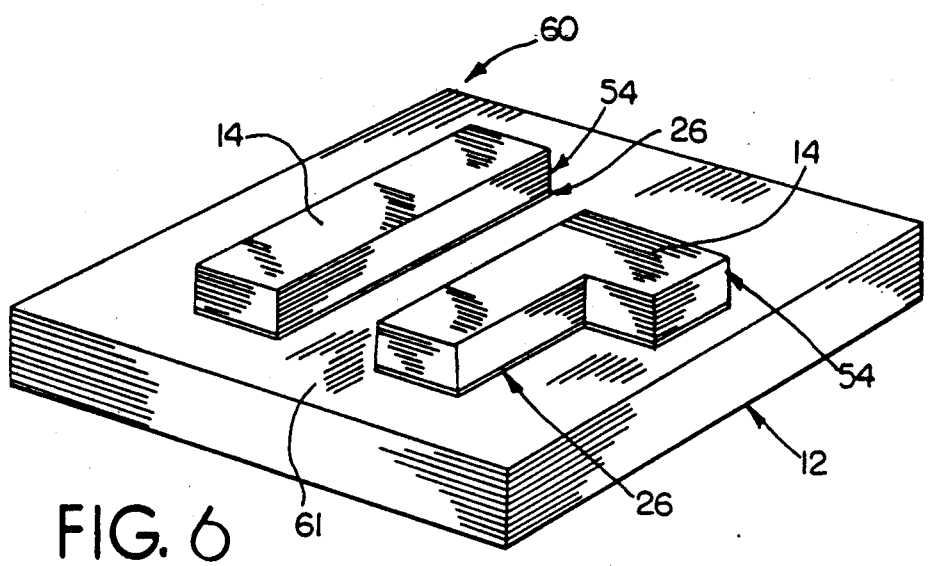
FIG. 6 is a perspective view of the pattern of FIG. 5 after a layer of copper has been deposited upon the portions of the layer of chromium that were not covered with photoresist subsequent to the development of the photoresist, and the developed photoresist and the portions of the layer of chromium situated beneath the developed photoresist have been removed to produce a finished fine-line pattern.

The areas of the layer of chromium 26 which have not been plated with the copper 54 are then selectively removed preferably utilizing a suitable etching solution such as about 1 molar sulfuric acid at a temperature of about 40° C. coupled with the touching of the layer of chromium 26 while the pattern 40 is immersed in the etching solution with a piece of metallic zinc so as to produce a finished fine-line pattern 60 as shown in FIG. 6. Finished fine-line pattern 60 comprises electrically conductive pathways 14 formed by the layer of chromium 26 plated with copper 54 and the insulative areas 61 which are formed by the non-metal bearing areas of the substrate 12. Finished fine-line pattern 60 may be utilized to produce a circuit board like circuit board 10 shown in FIG. 1 by attaching electrical components 16 thereto.

Examples of other acids suitable for use in selectively etching the layer of chromium 26 and producing fine-line pattern 60 include dilute and concentrated HX where X comprises fluorine, chlorine, bromine or iodine, acetic acid, non-oxidizing acids in the presence of suitable complexing or reducing agents such as thiourea ($NH_2.CS.NH_2$), and cathodic treatment in an acid or alkaline solution.

Circuit boards produced utilizing the method described above have shown line/space resolution of between about 0.0016 and about 0.0020 of an inch (i.e., a circuit pattern consisting of about 0.0016 and about 0.0020 of an inch conductive lines 14 and insulative spaces 15). Such fine-line capabilities allow a greater number of electrical components 16 to be mounted on the board thereby reducing the amount of space required for a given electrical circuit.

It will be appreciated that although in the previously described method the metallic foil utilized is copper foil, the present invention also contemplates the use of a metallic foil produced from any one of a variety or combination of conductive metals or alloys thereof, such as, for example, aluminum (Al), iron (Fe), titanium (Ti), chromium, platinum (Pt), tin, nickel (Ni) or silver (Au). Similarly, it will be appreciated that the invention also contemplates the deposition of subsequent layers of metal comprising any one of a variety of conductive metals, such as, for example, aluminum, iron, copper, tin, titanium, platinum, nickel or silver to form the composite 29.

For example, in another preferred embodiment the foil utilized may comprise copper, the metal deposited upon the copper foil to produce the composite 29 may comprise nickel, and the metal utilized to form the plated conductive layer of the finished fine-line pattern 60 may comprise copper. In order to produce a printed circuit board utilizing these particular metals an ammoniacal etching solution is preferably utilized when removing the copper foil from the layer of nickel to produce the thin film laminate 36. Such a solution selectively removes or etches away copper but not nickel. An example of an ammoniacal solution suitable for use with the present invention is a mixture of about 25 percent by volume water ($H_2O$), about 50 percent by volume of a solution A and about 25 percent by volume of a solution B. Solution A preferably comprises a mixture of water laden with ammonia gas. Such a solution may be produced by adding ammonium hydroxide ($NH_4OH$) and a suitable surfactant to water. Solution B comprises an etchant designated 19121MU-B and sold under the registered trademark METEX by MacDermid Incorporated of Waterbury, Conn. Preferably, the ammoniacal solution is utilized at a temperature of about 40° C.

In order to produce the finished fine-line pattern 60 utilizing nickel and copper as noted above, preferably a stripping solution is utilized to remove portions of the layer of nickel after the layer of copper has been deposited thereon. An example of a preferred stripping solution suitable for use with the present invention comprises a mixture of 140 grams/liter hydrogen peroxide ($H_2O_2$) including a sufficient amount of ammonium bifluoride ($NH_4HF_2$) such that the solution contains about 18 percent by weight fluoride. Preferably, the stripping solution is utilized at a temperature of about 40° C. Examples of other acids suitable for use in removing the layer of nickel include dilute HX wherein X comprises fluorine, chlorine, bromine or iodine, dilute sulfuric acid, phosphoric acid ($H_3PO_4$), and sulfurous acid ($SO(OH)_2$).

In another preferred embodiment the foil utilized to produce the composite 29 may comprise copper, the metal deposited upon the copper foil to produce the composite 29 may comprise tin, and the metal utilized to form the plated conductive layer of the finished fine-line pattern 60 may comprise copper. In order to produce a printed circuit board utilizing these particular metals the ammoniacal etching solution noted above is preferably utilized when removing the copper foil from the layer of tin to produce the thin film laminate 36. In order to remove the layer of tin and produce the fine-line pattern using these particular metals the stripping solution noted above is preferably utilized. Examples of other acids suitable for use in removing the layer of tin include hydrofluoric acid (HF), dilute and concentrated HX wherein X comprises fluorine, chlorine, bromine or iodine, dilute sulfuric acid, acetic and formic (H.COOH) acids as well as halogen substituted acetic acids, caustic alkali solutions of R—OH where R comprises lithium, potassium, sodium, rubidium, cesium, and cold aqueous $HXO_4$ or $HXO_3$ or $HXO_2$ or HXO where X comprises bromine, chlorine or iodine.

Although the invention has been shown and described with respect to certain preferred embodiments, it is obvious that equivalent alterations and modifications will occur to others skilled in the art upon the reading and understanding of the specification. The present invention includes all such equivalent alterations and modifications, and is limited only by the scope of the following claims.

What is claimed is:

1. A method of producing a circuit board comprising the steps of:
   (A) depositing a layer of a first metal upon a layer of a second metal having a different chemical composition than the layer of first metal;
   (B) attaching the layers of first and second metal to a support such that the layer of first metal is located between the support and the layer of second metal;
   (C) removing the layer of second metal from the layer of first metal to form a thin metal laminate;
   (D) applying a photoresist to the layer of first metal and irradiating portions of the photoresist;
   (E) removing portions of the photoresist so as to uncover portions of the layer of first metal and form a pattern; and
   (F) depositing a layer of third metal having a different chemical composition than the layer of first metal upon the uncovered portions of the layer of first metal.

2. A method of producing a circuit board as set forth in claim 1 including subsequent to said step (F) the steps of:
   (G) removing from the layer of first metal any remaining photoresist; and
   (H) removing from the support the portions of the layer of first metal which have no third metal deposited thereon so as to form a finished fine-line pattern.

3. A method of producing a circuit board as set forth in claim 1 wherein the layer of second metal comprises a metallic foil.

4. A method of producing a circuit board as set forth in claim 1 wherein the layer of second metal comprises copper (Cu) foil.

5. A method of producing a circuit board as set forth in claim 1 wherein said support comprises a layer of resin.

6. A method of producing a circuit board as set forth in claim 1 wherein said layer of first metal comprises chromium (Cr).

7. A method of producing a circuit board as set forth in claim 1 wherein the layer of first metal comprises chromium (Cr), the layer of second metal comprises copper (Cu) foil, and during said step (C) the layer of second metal is chemically removed from the layer of first metal.

8. A method of producing a circuit board as set forth in claim 7 wherein during said step (C) the chemical removal of the layer of second metal is accomplished utilizing a solution of cupric chloride ($CuCl_2$).

9. A method of producing a circuit board as set forth in claim 1 wherein the layer of third metal comprises nickel (Ni).

10. A method of producing a circuit board as set forth in claim 2 wherein the layer of first metal comprises chromium (Cr), the layer of second metal comprises copper (Cu), and during said step (H) the portions of the layer of first metal are chemically removed from the support.

11. A method of producing a circuit board as set forth in claim 10 wherein during said step (H) the uncovered portions of the layer of first metal are chemically removed utilizing a solution of sulfuric acid ($H_2SO_4$) and touching the layer of first metal with zinc (Zn).

12. A method of producing a circuit board as set forth in claim 2 wherein the layer of first metal comprises nickel (Ni).

13. A method of producing a circuit board as set forth in claim 12 wherein during said step (C) the second layer of metal is removed utilizing a solution containing water ($H_2O$) laden with ammonia ($NH_3$) gas.

14. A method of producing a circuit board as set forth in claim 12 wherein the layer of second metal comprises copper (Cu) and during said step (H) the portions of the layer of first metal are chemically removed.

15. A method of producing a circuit board as set forth in claim 14 wherein during said step (H) the portions of the layer of first metal are removed utilizing a solution comprising hydrogen peroxide ($H_2O_2$) and ammonium bifluoride ($NH_4HF_2$).

16. A method of producing a circuit board as set forth in claim 1 wherein the layer of first metal comprises tin.

17. A method of producing a circuit board as set forth in claim 16 wherein during said step (C) the layer of second metal is removed utilizing an etching solution containing water ($H_2O$) laden with ammonia gas.

18. A method of producing a circuit board as set forth in claim 16 wherein the layer of second metal comprises copper (Cu).

19. A method of producing a circuit board as set forth in claim 18 wherein during said step (H) the portions of the layer of first metal are chemically removed utilizing a stripping solution.

20. A method of producing a finished fine-line pattern for use in producing a printed circuit board comprising the steps of:
(A) electrodepositing a layer of a first metal upon a layer of a second metal so as to form a metal composite;
(B) laminating the metal composite to a support and forming a metals layers laminate wherein the layer of first metal is disposed between the support and the layer of second metal;
(C) removing the layer of second metal from the laminate to form a thin metal laminate;
(D) applying a photoresist to the layer of first metal and irradiating portions of the photoresist;
(E) removing portions of the photoresist so as to expose portions of the layer of first metal;
(F) depositing a layer of third metal upon the exposed portions of the layer of first metal;
(G) removing from the layer of first metal any remaining photoresist;
(H) removing from the support the portions of the layer of first metal which have no third metal deposited thereon so as to produce a finished fine-line pattern having conductive areas and insulative areas.

21. A method of producing a finished fine-line pattern as set forth in claim 20 wherein the support comprises an insulative resin substrate.

22. A method of producing a finished fine-line pattern as set forth in claim 20 wherein during said step (A) the layer of second metal comprises a metal foil and the finished fine-line pattern includes a circuit pattern consisting of less than about 0.0016 and less than about 0.0020 of an inch conductive lines and insulative spaces.

23. A method of producing a finished fine-line pattern as set forth in claim 20 wherein during said step (E) the non-irradiated portions of the photoresist are removed utilizing a developing solution.

24. A method of producing a finished fine-line pattern as set forth in claim 20 wherein during said step (G) the remaining photoresist is removed utilizing a solution of potassium hydroxide (KOH).

25. A method of producing a finished fine-line pattern as set forth in claim 20 wherein the layer of second metal comprises copper (Cu) foil having a surface with a matte finish of about 10 microns Rtm.

26. A method of producing a finished fine-line pattern as set forth in claim 20 wherein the layer of first metal has a thickness of less than about five microns.

27. A method of producing a finished fine-line pattern as set forth in claim 20 wherein the layer of second metal has a thickness of less than about 35 microns.

28. A method of producing a fine-line pattern for use in producing a circuit board comprising the steps of:
(A) electrodepositing a layer of a first metal upon a layer of a second metal comprising a section of copper (Cu) foil so as to form a composite;
(B) laminating the composite to a substrate so as to form a laminate wherein the first layer of metal is located between the substrate and the copper foil;
(C) chemically removing the copper foil from the laminate;
(D) applying a photoresist to the layer of first metal and exposing portions of the photoresist;
(E) removing portions of the photoresist thereby uncovering portions of the layer of first metal; and
(F) electrodepositing a layer of a third metal upon the uncovered portions of the layer of first metal.

29. A method of producing a fine-line pattern as set forth in claim 28 including the steps of:
(G) removing from the layer of first metal any remaining photoresist; and
(H) chemically removing from the substrate the portions of the layer of first metal which have no third metal deposited thereon.

30. A method of producing a fine-line pattern as set forth in claim 28 wherein the third metal comprises copper (Cu).

* * * * *